(12) United States Patent
Zhang et al.

(10) Patent No.: US 10,756,291 B2
(45) Date of Patent: Aug. 25, 2020

(54) METHOD OF MANUFACTURING AN OLED PANEL AND OLED PANEL

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventors: Liangfen Zhang, Guangdong (CN); Xiaoxing Zhang, Guangdong (CN); Jangsoon Im, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 442 days.

(21) Appl. No.: 15/578,393

(22) PCT Filed: Nov. 16, 2017

(86) PCT No.: PCT/CN2017/111433
§ 371 (c)(1),
(2) Date: Nov. 30, 2017

(87) PCT Pub. No.: WO2019/071711
PCT Pub. Date: Apr. 18, 2019

(65) Prior Publication Data
US 2020/0127225 A1    Apr. 23, 2020

(30) Foreign Application Priority Data
Oct. 13, 2017    (CN) .......................... 2017 1 0957781

(51) Int. Cl.
*H01L 27/32* (2006.01)
*H01L 51/52* (2006.01)
*H01L 51/56* (2006.01)

(52) U.S. Cl.
CPC ...... *H01L 51/5228* (2013.01); *H01L 27/3246* (2013.01); *H01L 27/3258* (2013.01);
(Continued)

(58) Field of Classification Search
CPC . H01L 51/5228; H01L 51/56; H01L 27/3211; H01L 27/3246; H01L 27/3258; H01L 27/3272; H01L 27/3279
See application file for complete search history.

(56) References Cited

U.S. PATENT DOCUMENTS

2006/0113900 A1* 6/2006 Oh ...................... H01L 27/3276
                                                          313/504
2007/0241664 A1* 10/2007 Sakamoto ........... H01L 27/3276
                                                          313/503
(Continued)

FOREIGN PATENT DOCUMENTS

CN    204257650    4/2015
CN    104752439    7/2015
(Continued)

*Primary Examiner* — Cuong Q Nguyen
(74) *Attorney, Agent, or Firm* — Hemisphere Law, PLLC; Zhigang Ma

(57) ABSTRACT

The embodiments of the disclosure provides a method of manufacturing an OLED panel and an OLED panel. The method includes: forming an anode electrode connected to a source electrode of a TFT and a bridge electrode connected to an auxiliary electrode on a TFT substrate; forming a plurality of metal protrusions on the bridge electrode, the surfaces of the metal protrusions having a plurality of corners; sequentially forming an electron transport layer, an electron injection layer and a cathode electrode on the bridge electrode and the metal protrusions; and applying a voltage
(Continued)

on the auxiliary electrode or the bridge electrode to burn a portion of the electron transport layer and a portion of the electron injection layer corresponding to the corners of the metal protrusions to connect the cathode electrode and the auxiliary electrode.

6 Claims, 6 Drawing Sheets

(52) U.S. Cl.
CPC .......... *H01L 27/3272* (2013.01); *H01L 51/56* (2013.01); *H01L 2227/323* (2013.01)

(56) References Cited

U.S. PATENT DOCUMENTS

| | | | |
|---|---|---|---|
| 2011/0248309 | A1 | 10/2011 | Han et al. |
| 2015/0236297 | A1* | 8/2015 | Hong .................. H01L 27/3258 257/40 |
| 2016/0240603 | A1* | 8/2016 | Park .................... H01L 27/3211 |

FOREIGN PATENT DOCUMENTS

| | | |
|---|---|---|
| CN | 104934461 | 9/2015 |
| CN | 106803547 | 6/2017 |
| CN | 106992267 | 7/2017 |

* cited by examiner

METHOD OF MANUFACTURING AN OLED PANEL AND OLED PANEL

RELATED APPLICATIONS

The present application is a National Phase of International Application No. PCT/CN2017/111433, filed on Nov. 16, 2017, and claims the priority of China Application No. 201710957781.7, filed on Oct. 13, 2017.

FIELD OF THE DISCLOSURE

The disclosure relates to the technical field of display device, and particularly to a method of manufacturing an OLED panel and an OLED panel.

BACKGROUND

The Organic Light Emitting Display (OLED) possesses many outstanding properties of self-illumination, low driving voltage, high luminescence efficiency, short response time, high clarity and contrast, near 180° view angle, wide range of working temperature, applicability of flexible display and large scale full color display. The OLED is considered as the most potential display device.

The OLED can be categorized into two major types according to the driving methods, which are the Passive Matrix OLED (PMOLED) and the Active Matrix OLED (AMOLED), i.e. two types of the direct addressing and the Thin Film Transistor (TFT) matrix addressing. The AMOLED comprises pixels arranged in array and belongs to active display type, which has high lighting efficiency and is generally utilized for the large scale display devices of high resolution.

The OLED display device is a spontaneous emission display device and is generally made of an ITO pixel electrode and a metal electrode respectively functioning as an anode and a cathode and an organic light emission layer arranged between the anode and the cathode. When a proper voltage is applied to the anode and the cathode, the organic light emission layer emits light. The organic light emission layer comprises a hole injection layer formed on the anode, a hole transport layer formed on the hole injection layer, an emissive layer formed on the hole transport layer, an electron transport layer formed on the emissive layer, and an electron injection layer formed on the electron transport layer. Light emitting mechanism is that when driven by a predetermined voltage, electrons and holes are respectively injected into the electron injection layer and the hole injection layer. The electrons and the holes migrate through the electron transport layer and the hole transport layer to the emissive layer and combine with each other in the emissive layer to form excitons that excite light-emitting molecules, the later undergoing radiation relaxation to give off visible light.

The OLED panel with large size will generate different IR drops at different positions due to the cathode electrode has a larger resistance, so the mura effect of the OLED panel will happen. Therefore, an auxiliary electrode connected to a cathode electrode is needed. The voltage applied on the cathode electrode via the auxiliary electrode could solve the mura effect due to the IR drop of the cathode electrode, so the display image of the OLED panel could be even and stable.

SUMMARY

The purpose of the disclosure is to provide a method of manufacturing an OLED panel, and the OLED panel has an auxiliary electrode connected to a cathode electrode, so the mura effect of the OLED panel due to IR drop of the cathode electrode could be improved.

The other purpose of the disclosure is to provide a method of manufacturing an OLED panel, and the OLED panel has an auxiliary electrode connected to a cathode electrode, so the mura effect of the OLED panel due to IR drop of the cathode electrode could be improved.

To achieve the above object, according to one aspect, the embodiment of the disclosure provides a method of manufacturing an OLED panel, including the following steps:

step S1: providing a TFT substrate, the TFT substrate including a base substrate, a TFT and an auxiliary electrode disposed on the base substrate and spaced apart from each other, and the TFT including a source electrode;

step S2: forming a planarization layer on the TFT substrate, and patterning the planarization layer to form a first via and a second via respectively exposing the source electrode and the auxiliary electrode;

step S3: forming an anode electrode and a bridge electrode spaced apart from the anode electrode, the anode electrode connected to the source electrode through the first via, and the bridge electrode connected to the auxiliary electrode through the second via;

step S4: forming a plurality of metal protrusions on the bridge electrode, the surfaces of the metal protrusions having a plurality of corners;

step S5: forming a pixel defining layer on the planarization layer, the anode electrode and the bridge electrode, the pixel defining layer including a first opening exposing the anode electrode, and the pixel defining layer exposing a region having the metal protrusions on the bridge electrode;

step S6: sequentially forming a hole injection layer, a hole transport layer and an emitting layer on the anode electrode in the first opening, and sequentially forming an electron transport layer, an electron injection layer and a cathode electrode on the emitting layer, the pixel defining layer, the bridge electrode and the metal protrusions; and step S7: applying a voltage on the auxiliary electrode or the bridge electrode to burn a portion of the electron transport layer and a portion of the electron injection layer corresponding to the corners of the metal protrusions and form a plurality of second openings, and the cathode electrode connected to the metal protrusions through the second openings.

In one embodiment, wherein the TFT includes:
an active layer, disposed on the base substrate;
a gate insulating layer and a gate electrode, sequentially disposed on the active layer;
an interlayer insulating layer, covering the active layer and the gate electrode; and
a drain electrode, spaced apart from the source electrode the drain electrode, and the drain electrode and the source electrode disposed on the interlayer insulating layer;
wherein the auxiliary electrode includes a first sub-auxiliary electrode, the first sub-auxiliary electrode is disposed on the interlayer insulating layer and spaced apart from the source electrode and the drain electrode, and the second via exposes the first sub-auxiliary electrode;
wherein the interlayer insulating layer includes a third via and a fourth via respectively disposed on two sides of the active layer, and the source electrode and the drain electrode is respectively connected to the two sides of the active layer through the third via and the fourth via.

In one embodiment, wherein the auxiliary electrode further includes a second sub-auxiliary electrode, the second sub-auxiliary electrode is disposed on the base substrate;

wherein the TFT substrate further includes:

a metal shielding layer, disposed on the base substrate and spaced apart from the second sub-auxiliary electrode; and a buffer layer, disposed on the base substrate and covering the metal shielding layer and the second sub-auxiliary electrode;

wherein the active layer is disposed on the buffer layer and corresponding to the metal shielding layer, the interlayer insulating layer is disposed on the buffer layer and covers the active layer and the gate electrode, the buffer layer and the interlayer insulating layer include a fifth via exposed the second sub-auxiliary electrode, and the first sub-auxiliary electrode is connected to the second sub-auxiliary electrode through the fifth via.

In one embodiment, wherein the TFT substrate further comprises a passivation layer covering the insulating layer, the source electrode, the drain electrode and the first sub-auxiliary electrode, the planarization layer is formed on the passivation layer, the passivation layer includes a sixth via and a seventh via respectively exposing the source electrode and the first sub-auxiliary electrode, and the first via and the second via are respectively disposed on the sixth via and the seventh via.

In one embodiment, wherein the metal protrusions are block-shaped or stripe-shaped, and the sectional views of the metal protrusions are triangle-shaped or rectangle-shaped.

According to another aspect, the embodiment of the disclosure provides an OLED panel, including:

a TFT substrate, the TFT substrate including a base substrate, a TFT and an auxiliary electrode disposed on the base substrate and spaced apart from each other, and the TFT including a source electrode;

a planarization layer, disposed on the TFT substrate and the planarization layer including a first via and a second via respectively exposing the source electrode and the auxiliary electrode;

an anode electrode, disposed on the planarization layer and connected to the source electrode through the first via;

a bridge electrode, disposed on the planarization layer, spaced apart from the anode electrode, and connected to the auxiliary electrode through the second via;

a plurality of metal protrusions, disposed on the bridge electrode, and the surfaces of the metal protrusions having a plurality of corners;

a pixel defining layer, disposed on the planarization layer, the anode electrode and the bridge electrode, the pixel defining layer including a first opening exposing the anode electrode, and the pixel defining layer exposing a region having the metal protrusions on the bridge electrode;

a hole injection layer, a hole transport layer and an emitting layer, sequentially disposed on the anode electrode in the first opening;

an electron transport layer and an electron injection layer, sequentially disposed on the emitting layer, the pixel defining layer, the bridge electrode and the metal protrusions, and the electron transport layer and the electron injection layer including a plurality of second openings corresponding to the corners of the metal protrusions;

a cathode electrode, disposed on the electron injection layer, and the cathode electrode connected to the metal protrusions through the second openings.

In one embodiment, wherein the TFT includes:

an active layer, disposed on the base substrate;

a gate insulating layer and a gate electrode, sequentially disposed on the active layer;

an interlayer insulating layer, covering the active layer and the gate electrode; and a drain electrode, spaced apart from the source electrode the drain electrode, and the drain electrode and the source electrode disposed on the interlayer insulating layer;

wherein the auxiliary electrode includes a first sub-auxiliary electrode, the first sub-auxiliary electrode is disposed on the interlayer insulating layer and spaced apart from the source electrode and the drain electrode, and the second via exposes the first sub-auxiliary electrode;

wherein the interlayer insulating layer includes a third via and a fourth via respectively disposed on two sides of the active layer, and the source electrode and the drain electrode is respectively connected to the two sides of the active layer through the third via and the fourth via.

In one embodiment, wherein the auxiliary electrode further includes a second sub-auxiliary electrode, the second sub-auxiliary electrode is disposed on the base substrate;

wherein the TFT substrate further includes:

a metal shielding layer, disposed on the base substrate and spaced apart from the second sub-auxiliary electrode; and a buffer layer, disposed on the base substrate and covering the metal shielding layer and the second sub-auxiliary electrode;

wherein the active layer is disposed on the buffer layer and corresponding to the metal shielding layer, the interlayer insulating layer is disposed on the buffer layer and covers the active layer and the gate electrode, the buffer layer and the interlayer insulating layer include a fifth via exposed the second sub-auxiliary electrode, and the first sub-auxiliary electrode is connected to the second sub-auxiliary electrode through the fifth via.

In one embodiment, wherein the TFT substrate further includes a passivation layer covering the insulating layer, the source electrode, the drain electrode and the first sub-auxiliary electrode, the planarization layer is formed on the passivation layer, the passivation layer includes a sixth via and a seventh via respectively exposing the source electrode and the first sub-auxiliary electrode, and the first via and the second via are respectively disposed on the sixth via and the seventh via.

In one embodiment, wherein the metal protrusions are block-shaped or stripe-shaped, and the sectional views of the metal protrusions are triangle-shaped or rectangle-shaped.

Furthermore, according to another aspect, the embodiment of the disclosure provides a method of manufacturing an OLED panel, including the following steps:

step S1: providing a TFT substrate, the TFT substrate including a base substrate, a TFT and an auxiliary electrode disposed on the base substrate and spaced apart from each other, and the TFT comprising a source electrode;

step S2: forming a planarization layer on the TFT substrate, and patterning the planarization layer to form a first via and a second via respectively exposing the source electrode and the auxiliary electrode;

step S3; forming an anode electrode and a bridge electrode spaced apart from the anode electrode, the anode electrode connected to the source electrode through the first via, and the bridge electrode connected to the auxiliary electrode through the second via;

step S4: forming a plurality of metal protrusions on the bridge electrode, the surfaces of the metal protrusions having a plurality of corners;

step S5: forming a pixel defining layer on the planarization layer, the anode electrode and the bridge electrode, the pixel defining layer including a first opening exposing the anode electrode, and the pixel defining layer exposing a region having the metal protrusions on the bridge electrode;

step S6: sequentially forming a hole injection layer, a hole transport layer and an emitting layer on the anode electrode in the first opening, and sequentially forming an electron transport layer, an electron injection layer and a cathode electrode on the emitting layer, the pixel defining layer, the bridge electrode and the metal protrusions; and step S7: applying a voltage on the auxiliary electrode or the bridge electrode to burn a portion of the electron transport layer and a portion of the electron injection layer corresponding to the corners of the metal protrusions and form a plurality of second openings, and the cathode electrode connected to the metal protrusions through the second openings;

wherein the TFT includes:

an active layer, disposed on the base substrate;

a gate insulating layer and a gate electrode, sequentially disposed on the active layer;

an interlayer insulating layer, covering the active layer and the gate electrode; and a drain electrode, spaced apart from the source electrode the drain electrode, and the drain electrode and the source electrode disposed on the interlayer insulating layer;

wherein the auxiliary electrode includes a first sub-auxiliary electrode, the first sub-auxiliary electrode is disposed on the interlayer insulating layer and spaced apart from the source electrode and the drain electrode, and the second via exposes the first sub-auxiliary electrode;

wherein the interlayer insulating layer includes a third via and a fourth via respectively disposed on two sides of the active layer, and the source electrode and the drain electrode is respectively connected to the two sides of the active layer through the third via and the fourth via;

wherein the auxiliary electrode further includes a second sub-auxiliary electrode, the second sub-auxiliary electrode is disposed on the base substrate;

wherein the TFT substrate further includes:

a metal shielding layer, disposed on the base substrate and spaced apart from the second sub-auxiliary electrode; and a buffer layer, disposed on the base substrate and covering the metal shielding layer and the second sub-auxiliary electrode;

wherein the active layer is disposed on the buffer layer and corresponding to the metal shielding layer, the interlayer insulating layer is disposed on the buffer layer and covers the active layer and the gate electrode, the buffer layer and the interlayer insulating layer include a fifth via exposed the second sub-auxiliary electrode, and the first sub-auxiliary electrode is connected to the second sub-auxiliary electrode through the fifth via;

wherein the TFT substrate further includes a passivation layer covering the insulating layer, the source electrode, the drain electrode and the first sub-auxiliary electrode, the planarization layer is formed on the passivation layer, the passivation layer includes a sixth via and a seventh via respectively exposing the source electrode and the first sub-auxiliary electrode, and the first via and the second via are respectively disposed on the sixth via and the seventh via;

wherein the metal protrusions are block-shaped or stripe-shaped, and the sectional views of the metal protrusions are triangle-shaped or rectangle-shaped.

By applying the technical solution according to the embodiment of the disclosure, the method of manufacturing an OLED panel includes: forming an anode electrode connected to a source electrode of a TFT and a bridge electrode connected to an auxiliary electrode on a TFT substrate; forming a plurality of metal protrusions on the bridge electrode, the surfaces of the metal protrusions having a plurality of corners; sequentially forming an electron transport layer, an electron injection layer and a cathode electrode on the bridge electrode and the metal protrusions; and applying a voltage on the auxiliary electrode or the bridge electrode to burn a portion of the electron transport layer and a portion of the electron injection layer corresponding to the corners of the metal protrusions to connect the cathode electrode and the auxiliary electrode. By practice of the disclosure, the OLED panel could input the signal to the cathode electrode via the auxiliary electrode when displaying, so the mura effect of the OLED panel due to IR drop of the cathode electrode could be improved.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The specific structural and functional details disclosed herein are only representative and are intended for describing exemplary embodiments of the disclosure. However, the disclosure can be embodied in many forms of substitution, and should not be interpreted as merely limited to the embodiments described herein.

The disclosure will be further described in detail with reference to accompanying drawings and preferred embodiments as follows.

Figure 1:
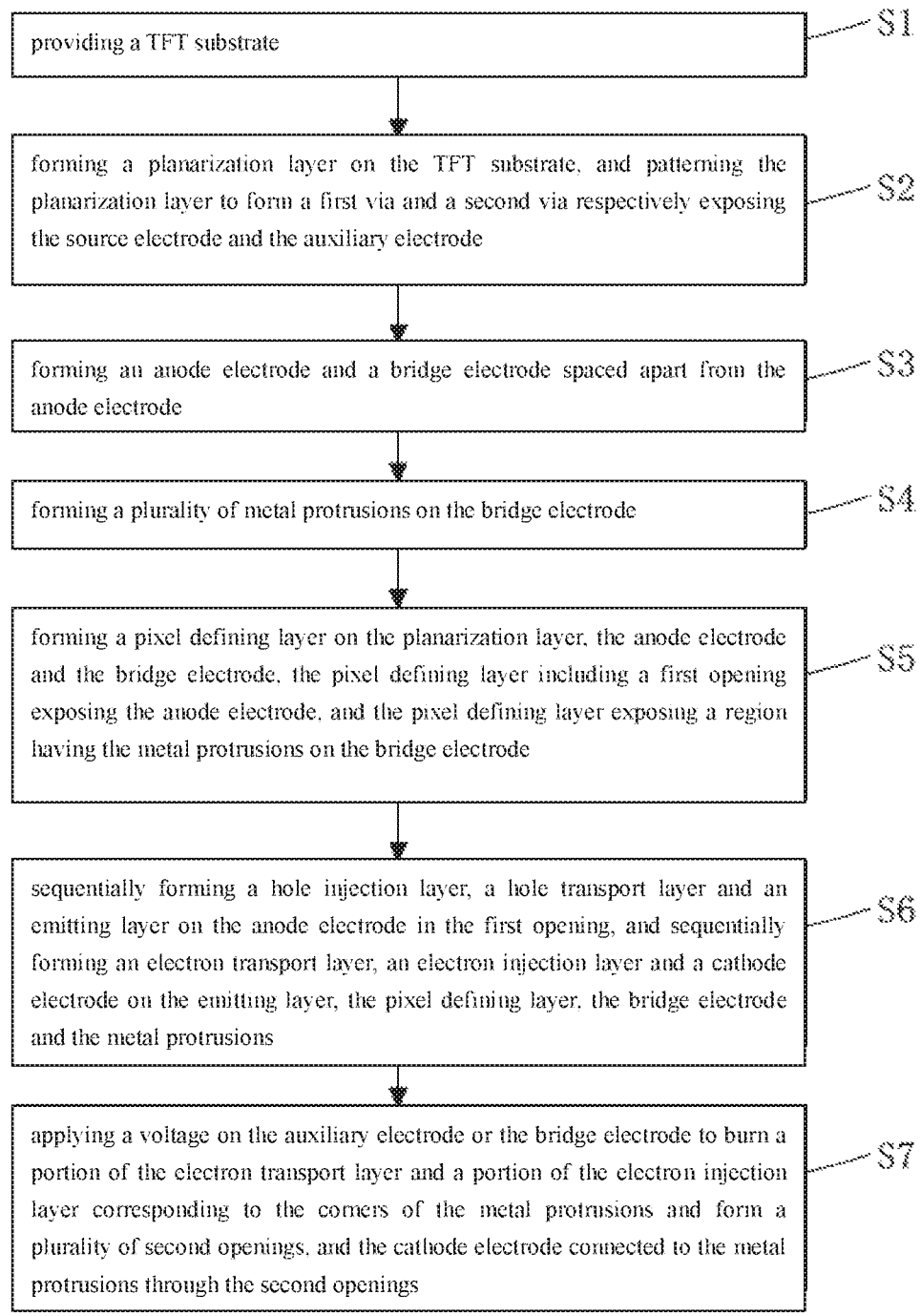
FIG. 1 is a flow chart diagram of a method of manufacturing an OLED panel according to an embodiment of the disclosure.
Figure 2:
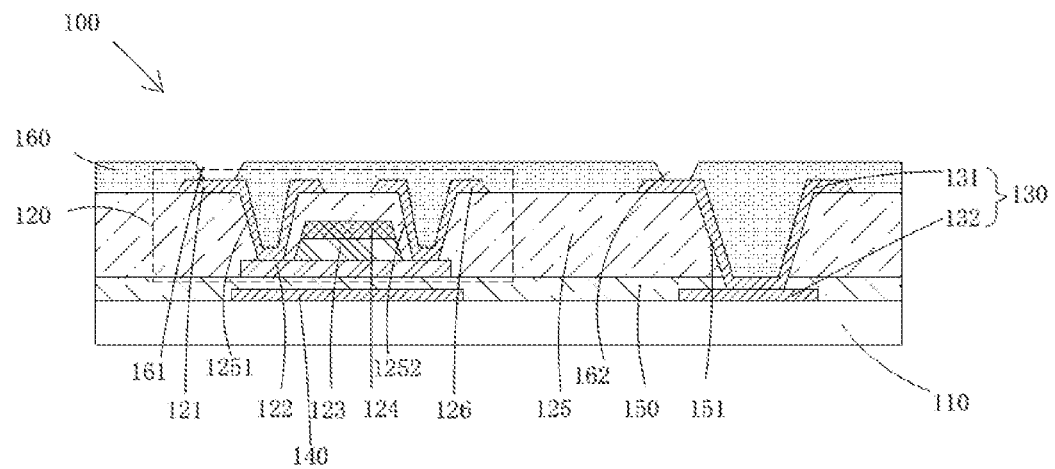
FIG. 2 is a structural schematic view of the step S1 of the method of manufacturing an OLED panel according to an embodiment of the disclosure.

As FIG. 1 shown, is a flow chart diagram of a method of manufacturing an OLED panel according to an embodiment of the disclosure. In this embodiment, the method of manufacturing an OLED panel includes the following steps:

Step S1: please refer to FIG. 2, providing a TFT substrate 100.

The TFT substrate 100 includes a base substrate 110, a TFT 120 and an auxiliary electrode 130 disposed on the base substrate 110 and spaced apart from each other, and the TFT 120 includes a source electrode 121.

Specifically, in the embodiment of FIG. 2, the TFT 120 is a thin film transistor of top gate type, which includes an active layer 122 disposed on the base substrate 110, a gate insulating layer 123 and a gate electrode 124 sequentially disposed on the active layer 122, an interlayer insulating layer 125 covering the active layer 122 and the gate electrode 124, and a drain electrode 126 spaced apart from the source electrode 121, and the drain electrode 126 and the source electrode 121 disposed on the interlayer insulating layer. In some embodiments, the TFT 120 may be a thin film transistor of bottom gate type.

Specifically, the TFT 120 may includes low temperature poly-silicon (LTPS) thin film transistor, oxide semiconductor thin film transistor, solid phase crystallization (SPC) thin film transistor, or other thin film transistor usually used in OLED display.

Specifically, as FIG. 2 shown, the auxiliary electrode 130 includes a first sub-auxiliary electrode 131, the first sub-auxiliary electrode 131 is disposed on the interlayer insulating layer 125 and spaced apart from the source electrode 121 and the drain electrode 126.

The interlayer insulating layer 125 includes a third via 1251 and a fourth via 1252 respectively disposed on two sides of the active layer 122, and the source electrode 121 and the drain electrode 126 are respectively connected to the two sides of the active layer 122 through the third via 1251 and the fourth via 1252.

Specifically, the auxiliary electrode 130 further includes a second sub-auxiliary electrode 132 disposed on the base substrate 110.

Specifically, in the embodiment of FIG. 2, the TFT 120 is a thin film transistor of top gate type, the TFT substrate 100 further includes: a metal shielding layer 140 disposed on the base substrate 110 and spaced apart from the second sub-auxiliary electrode 132, and a buffer layer 150 disposed on the base substrate 110 and covering the metal shielding layer 140 and the second sub-auxiliary electrode 132, wherein the active layer 122 is disposed on the buffer layer 150 and corresponding to the metal shielding layer 140, the interlayer insulating layer 125 is disposed on the buffer layer 150 and covers the active layer 122 and the gate electrode 124, the buffer layer 150 and the interlayer insulating layer 125 include a fifth via 151 exposed the second sub-auxiliary electrode 132, and the first sub-auxiliary electrode 131 is connected to the second sub-auxiliary electrode 132 through the fifth via 151.

Furthermore, the second sub-auxiliary electrode 132 and the metal shielding layer 140 could be formed by the same mask process.

Specifically, as FIG. 2 shown, the TFT substrate 100 further includes a passivation layer 160 covering the interlayer insulating layer 125, the source electrode 121, the drain electrode 126 and the first sub-auxiliary electrode 131, the passivation layer 160 includes a sixth via 161 and a seventh via 162 respectively exposing the source electrode 121 and the first sub-auxiliary electrode 131.

Figure 3:
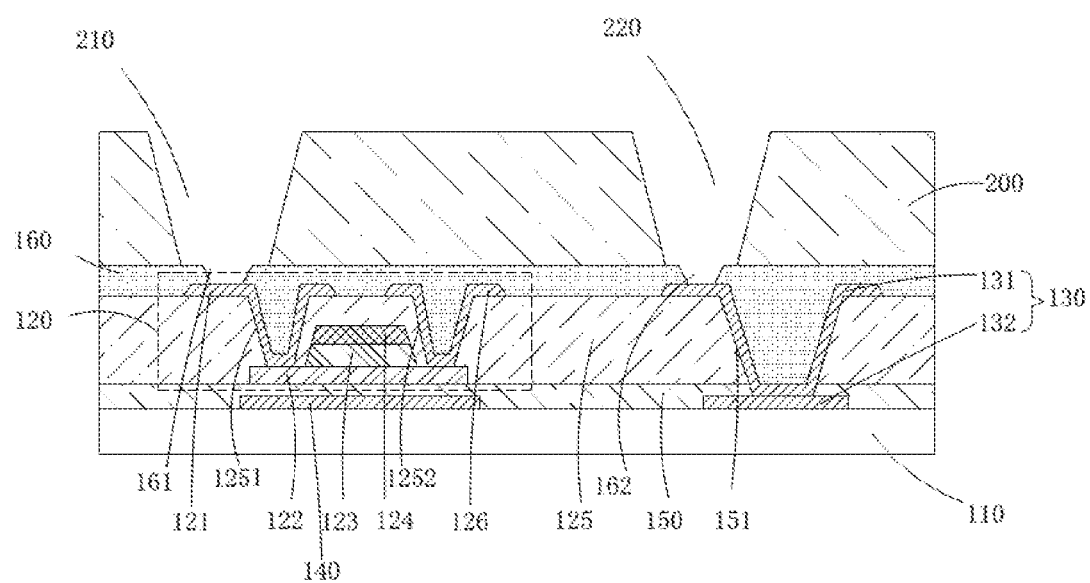
FIG. 3 is a structural schematic view of the step S2 of the method of manufacturing an OLED panel according to an embodiment of the disclosure.

Step S2: please refer to FIG. 3, forming a planarization layer 200 on the TFT substrate 100, and patterning the planarization layer 200 to form a first via 210 and a second via 220 respectively exposing the source electrode 121 and the auxiliary electrode 130.

Specifically, as FIG. 3 shown, the planarization layer 200 is formed on the passivation layer 160, the first via 210 and the second via 220 are respectively disposed on the sixth via 161 and the seventh via 162, and the second via 220 exposes the first sub-auxiliary electrode 131.

Figure 4:
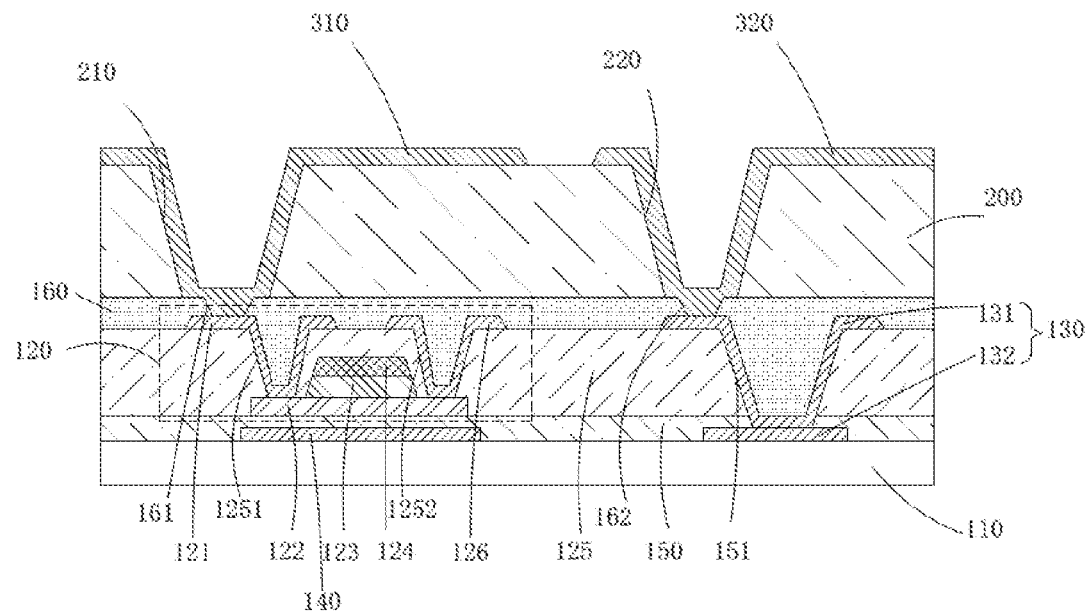
FIG. 4 is a structural schematic view of the step S3 of the method of manufacturing an OLED panel according to an embodiment of the disclosure.

Step S3: please refer to FIG. 4, forming an anode electrode 310 and a bridge electrode 320 spaced apart from the anode electrode 310 on the planarization layer 200.

The anode electrode 310 is connected to the source electrode 121 through the first via 210, and the bridge electrode 320 is connected to the auxiliary electrode 130 through the second via 220.

Specifically, the material and the thickness of the anode electrode 310 and the bridge electrode 320 could be the same or different.

Furthermore, when the material and the thickness of the anode electrode 310 and the bridge electrode 320 are the same, the anode electrode 310 and the bridge electrode 320 could be obtained by forming a anode material layer on the planarization layer 200 and patterning the anode material layer.

Figure 5:
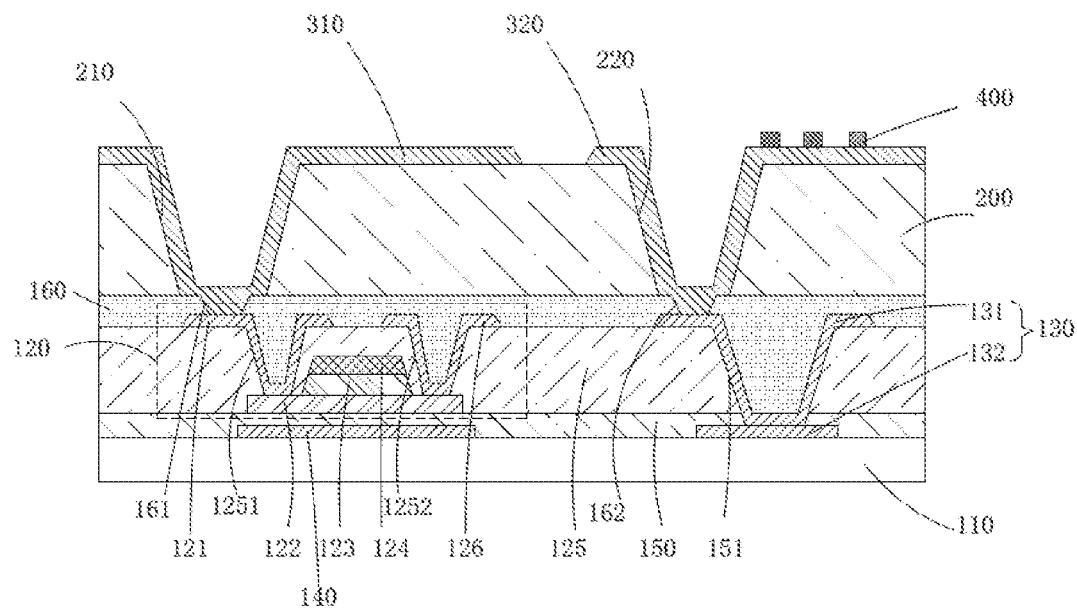
FIG. 5 is a structural schematic view of the step S4 of the method of manufacturing an OLED panel according to an embodiment of the disclosure.

Step S4: please refer to FIG. 5, forming a plurality of metal protrusions 400 on the bridge electrode 320, the surfaces of the metal protrusions 400 having a plurality of corners.

Specifically, the metal protrusions 400 are block-shaped, stripe-shaped, or other shapes.

Specifically, in the embodiment of FIG. 5, the sectional views of the metal protrusions 400 are rectangle-shaped, which means the boundary of the top surface and the side surface of the metal protrusions 400 have corners. In some embodiments, the sectional views of the metal protrusions 400 may be triangle-shaped or other shapes with corners on the surface.

Figure 6:
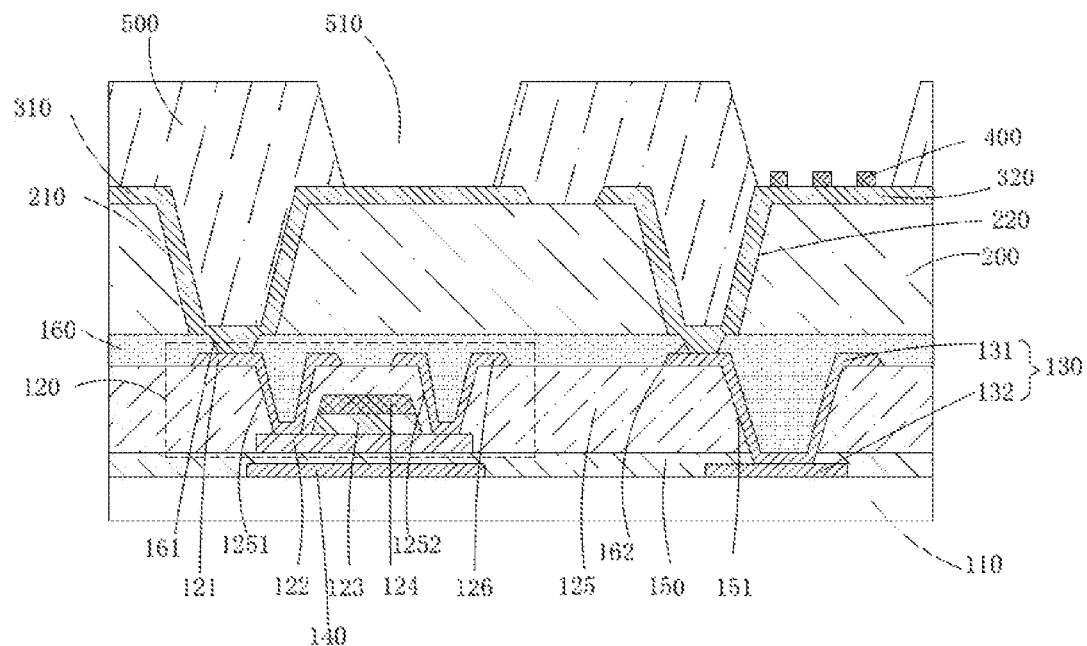
FIG. 6 is a structural schematic view of the step S5 of the method of manufacturing an OLED panel according to an embodiment of the disclosure.

Step S5: please refer to FIG. 6, forming a pixel defining layer 500 on the planarization layer 200, the anode electrode 310 and the bridge electrode 320, the pixel defining layer 500 including a first opening 510 exposing the anode electrode 310, and the pixel defining layer 500 exposing a region having the metal protrusions 400 on the bridge electrode 320.

Specifically, the first opening 510 defines the pixel area of the OLED panel.

Specifically, the hydrophilicity and the hydrophobicity of the pixel defining layer 500 is determined by the process of forming the OLED function layers (hole injection layer, hole transport layer, emitting layer, electron transport layer, and electron injection layer) in the first opening 510. When the process of forming the OLED function layers in the first opening 510 is deposition, the material of the pixel defining layer 500 is non-hydrophobic material. When the process of forming the OLED function layers in the first opening 510 is ink-jet printing, the material of the pixel defining layer 500 is hydrophobic material.

Figure 7:
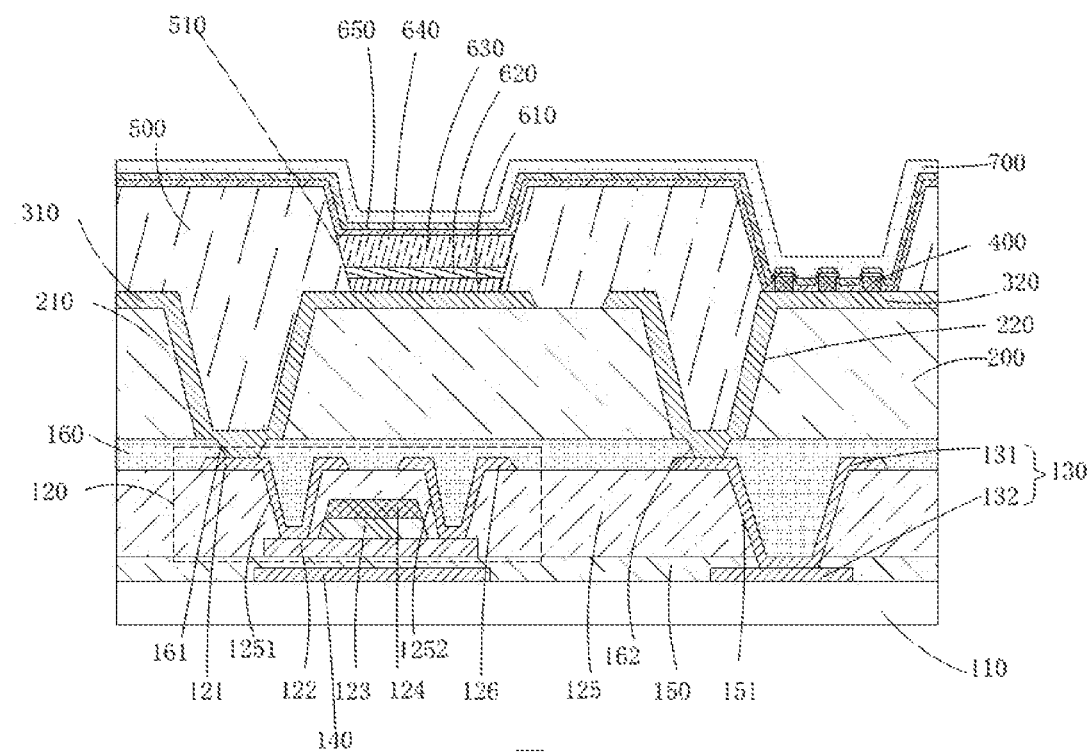
FIG. 7 is a structural schematic view of the step S6 of the method of manufacturing an OLED panel according to an embodiment of the disclosure.
Figure 8:
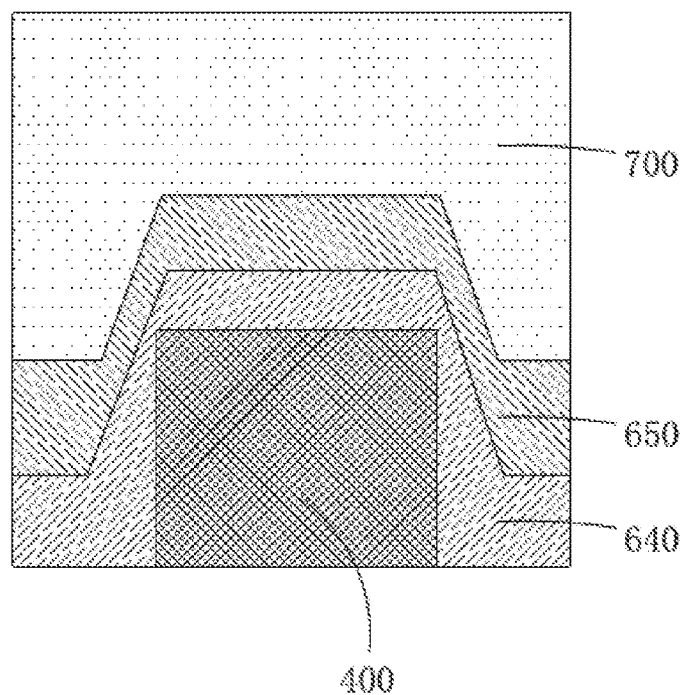
FIG. 8 is an enlarged structural schematic view of the position of the metal protrusion after the step S6 of the method of manufacturing an OLED panel according to an embodiment of the disclosure.

Step S6: please refer to FIG. 7 and FIG. 8, sequentially forming a hole injection layer 610, a hole transport layer 620 and an emitting layer 630 on the anode electrode 310 in the first opening 510, and sequentially forming an electron transport layer 640, an electron injection layer 650 and a cathode electrode 700 on the emitting layer 630, the pixel defining layer 500, the bridge electrode 320 and the metal protrusions 400.

Specifically, as FIG. 8 shown, because the surface of the bridge electrode 320 has the metal protrusions 400 with corners, after forming the electron transport layer 640 and the electron injection layer 650 on the metal protrusions 400, the thickness of the electron transport layer 640 and the electron injection layer 650 corresponding to the corners of the metal protrusions 400 is thinner.

Figure 9:
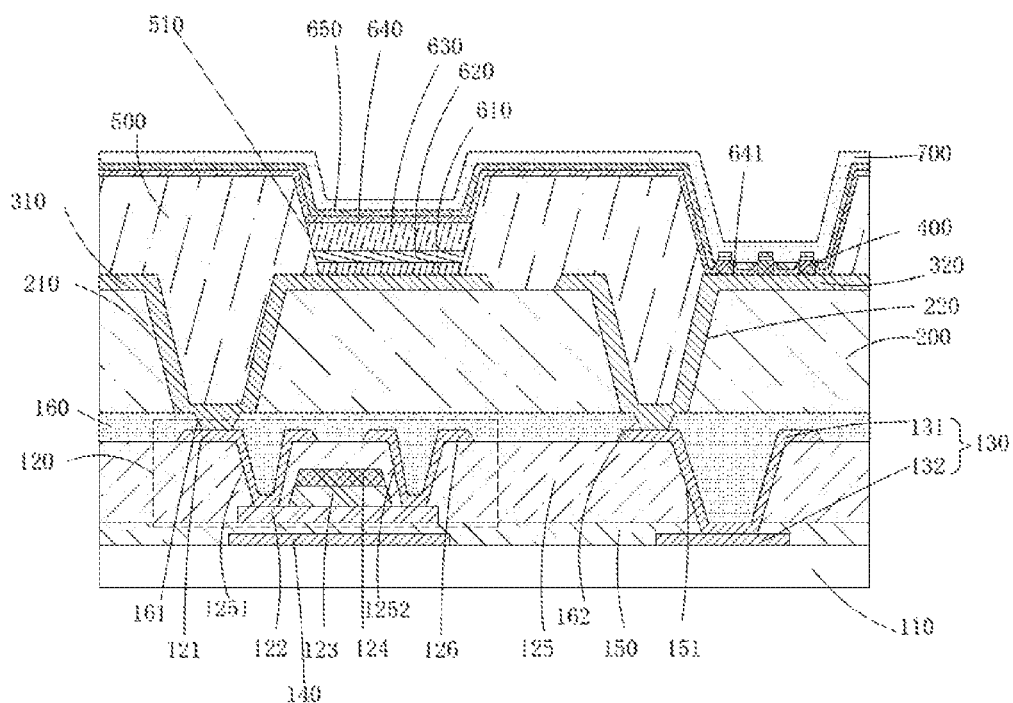
FIG. 9 is a structural schematic view of the step S7 of the method of manufacturing an OLED panel and the OLED panel according to an embodiment of the disclosure.
Figure 10:
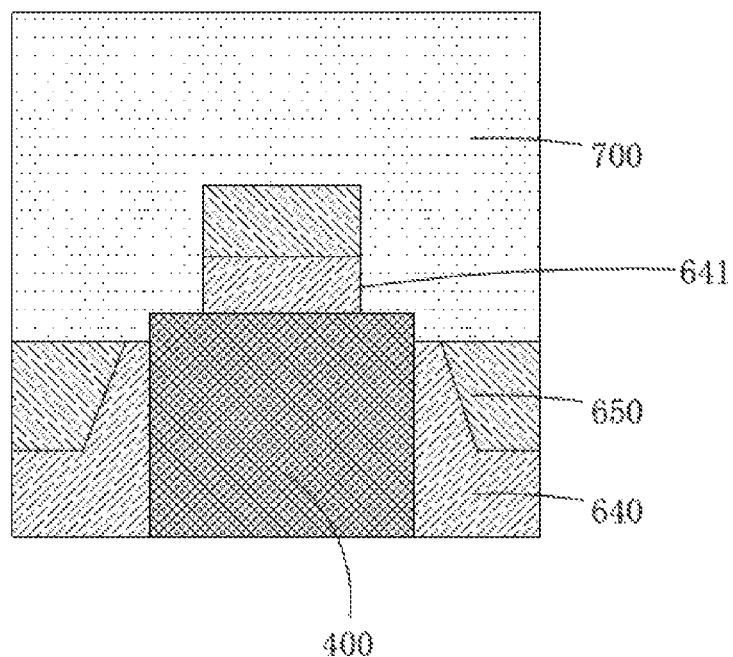
FIG. 10 is an enlarged structural schematic view of the position of the metal protrusion after the step S1 of the method of manufacturing an OLED panel according to an embodiment of the disclosure.

Step S7: please refer to FIG. 9 and FIG. 10, applying a voltage on the auxiliary electrode 130 or the bridge electrode 320 to burn a portion of the electron transport layer 640 and a portion of the electron injection layer 650 corresponding to the corners of the metal protrusions 400 and form a plurality of second openings 641, and the cathode electrode 700 connected to the metal protrusions 400 through the second openings 641.

Specifically, as FIG. 10 shown, because the thickness of the electron transport layer 640 and the electron injection layer 650 corresponding to the corners of the metal protrusions 400 is thinner, the resistance of the corners of the metal protrusions 400 is larger after the voltage applied on the auxiliary electrode 130 and the bridge electrode 320, a lot of heat will be released. The material of the electron transport layer 640 and the electron injection layer 650 is organic material, so the heat generated by the corners of the metal protrusions 400 will burn the portion of the electron transport layer 640 and the portion of the electron injection layer 650 corresponding to the corners of the metal protrusions 400, and form a plurality of second openings 641, and the cathode electrode 700 is connected to the metal protrusions 400, then the cathode electrode 700 is electrically connected to the the auxiliary electrode 130 and the bridge electrode 320. In this way, the OLED panel could input the signal to the cathode electrode 700 via the auxiliary electrode 130 when displaying, so the mura effect of the OLED panel due to IR drop of the cathode electrode 700 could be improved.

Please referring to FIG. 9 and FIG. 10, the embodiment of the disclosure provides an OLED panel, including: a TFT substrate 100, the TFT substrate 100 including a base substrate 110, a TFT 120 and an auxiliary electrode 130 disposed on the base substrate 110 and spaced apart from each other, and the TFT 120 including a source electrode 121; a planarization layer 200 disposed on the TFT substrate 100 and the planarization layer 200 including a first via 210 and a second via 220 respectively exposing the source electrode 121 and the auxiliary electrode 130; an anode electrode 310 disposed on the planarization layer 200 and connected to the source electrode 121 through the first via 210; a bridge electrode 320 disposed on the planarization layer 200, spaced apart from the anode electrode 310, and connected to the auxiliary electrode 130 through the second via 220; a plurality of metal protrusions 400 disposed on the bridge electrode 320, and the surfaces of the metal protrusions 400 having a plurality of corners; a pixel defining layer 500 disposed on the planarization layer 200, the anode electrode 310 and the bridge electrode 320, the pixel defining layer 500 including a first opening 510 exposing the anode electrode 310, and the pixel defining layer 500 exposing a region having the metal protrusions 400 on the bridge electrode 320; a hole injection layer 610, a hole transport layer 620 and an emitting layer 630, sequentially disposed on the anode electrode 310 in the first opening 510; an electron transport layer 640 and an electron injection layer 650, sequentially disposed on the emitting layer 630, the pixel defining layer 500, the bridge electrode 320 and the metal protrusions 400, and the electron transport layer 640 and the electron injection layer 650 including a plurality of second openings 641 corresponding to the corners of the metal protrusions 400; and a cathode electrode 700, disposed on the electron injection layer 650, and the cathode electrode 700 connected to the metal protrusions 400 through the second openings 641.

Specifically, in the embodiment of FIG. 9, the TFT 120 is a thin film transistor of top gate type, which includes an active layer 122 disposed on the base substrate 110, a gate insulating layer 123 and a gate electrode 124 sequentially disposed on the active layer 122, an interlayer insulating layer 125 covering the active layer 122 and the gate electrode 124, and a drain electrode 126 spaced apart from the source electrode 121, and the drain electrode 126 and the source electrode 121 disposed on the interlayer insulating layer. In some embodiments, the TFT 120 may be a thin film transistor of bottom gate type.

Specifically, the TFT 120 may includes low temperature poly-silicon (LTPS) thin film transistor, oxide semiconductor thin film transistor, solid phase crystallization (SPC) thin film transistor, or other thin film transistor usually used in OLED display.

Specifically, as FIG. 9 shown, the auxiliary electrode 130 includes a first sub-auxiliary electrode 131, the first sub-auxiliary electrode 131 is disposed on the interlayer insulating layer 125 and spaced apart from the source electrode 121 and the drain electrode 126.

The interlayer insulating layer 125 includes a third via 1251 and a fourth via 1252 respectively disposed on two sides of the active layer 122, and the source electrode 121 and the drain electrode 126 are respectively connected to the two sides of the active layer 122 through the third via 1251 and the fourth via 1252.

Specifically, the auxiliary electrode 130 further includes a second sub-auxiliary electrode 132 disposed on the base substrate 110.

Specifically, in the embodiment of FIG. 9, the TFT 120 is a thin film transistor of top gate type, the TFT substrate 100 further includes: a metal shielding layer 140 disposed on the base substrate 110 and spaced apart from the second sub-auxiliary electrode 132, and a buffer layer 150 disposed on the base substrate 110 and covering the metal shielding layer 140 and the second sub-auxiliary electrode 132, wherein the active layer 122 is disposed on the buffer layer 150 and corresponding to the metal shielding layer 140, the interlayer insulating layer 125 is disposed on the buffer layer 150 and covers the active layer 122 and the gate electrode 124, the buffer layer 150 and the interlayer insulating layer 125 include a fifth via 151 exposed the second sub-auxiliary electrode 132, and the first sub-auxiliary electrode 131 is connected to the second sub-auxiliary electrode 132 through the fifth via 151.

Furthermore, the second sub-auxiliary electrode 132 and the metal shielding layer 140 could be formed by the same mask process.

Specifically, as FIG. 9 shown, the TFT substrate 100 further includes a passivation layer 160 covering the interlayer insulating layer 125, the source electrode 121, the drain electrode 126 and the first sub-auxiliary electrode 131, the passivation layer 160 includes a sixth via 161 and a seventh via 162 respectively exposing the source electrode 121 and the first sub-auxiliary electrode 131.

Specifically, as FIG. 9 shown, the planarization layer 200 is formed on the passivation layer 160, the first via 210 and the second via 220 are respectively disposed on the sixth via 161 and the seventh via 162, and the second via 220 exposes the first sub-auxiliary electrode 131.

Specifically, the material and the thickness of the anode electrode 310 and the bridge electrode 320 could be the same or different.

Specifically, the metal protrusions 400 are block-shaped, stripe-shaped, or other shapes.

Specifically, in the embodiment of FIG. 9, the sectional views of the metal protrusions 400 are rectangle-shaped, which means the boundary of the top surface and the side surface of the metal protrusions 400 have corners. In some embodiments, the sectional views of the metal protrusions 400 may be triangle-shaped or other shapes with corners on the surface.

Specifically, the first opening 510 defines the pixel area of the OLED panel.

Specifically, the hydrophilicity and the hydrophobicity of the pixel defining layer 500 is determined by the process of forming the OLED function layers (hole injection layer, hole transport layer, emitting layer, electron transport layer, and electron injection layer) in the first opening 510. When the process of forming the OLED function layers in the first opening 510 is deposition, the material of the pixel defining layer 500 is non-hydrophobic material. When the process of forming the OLED function layers in the first opening 510 is ink-jet printing, the material of the pixel defining layer 500 is hydrophobic material.

It should be noted that, as FIG. 9 and FIG. 10 shown, because the thickness of the electron transport layer 640 and the electron injection layer 650 corresponding to the corners of the metal protrusions 400 is thinner, the resistance of the corners of the metal protrusions 400 is larger after the voltage applied on the auxiliary electrode 130 and the bridge electrode 320, a lot of heat will be released. The material of the electron transport layer 640 and the electron injection layer 650 is organic material, so the heat generated by the corners of the metal protrusions 400 will burn the portion of the electron transport layer 640 and the portion of the electron injection layer 650 corresponding to the corners of the metal protrusions 400, and form a plurality of second openings 641, and the cathode electrode 700 is connected to the metal protrusions 400, then the cathode electrode 700 is electrically connected to the the auxiliary electrode 130 and the bridge electrode 320. In this way, the OLED panel could input the signal to the cathode electrode 700 via the auxiliary electrode 130 when displaying, so the mura effect of the OLED panel due to IR drop of the cathode electrode 700 could be improved.

In summary, the embodiments of the disclosure provides a method of manufacturing an OLED panel and an OLED panel. The method includes: forming an anode electrode connected to a source electrode of a TFT and a bridge electrode connected to an auxiliary electrode on a TFT substrate; forming a plurality of metal protrusions on the bridge electrode, the surfaces of the metal protrusions having a plurality of corners; sequentially forming an electron transport layer, an electron injection layer and a cathode electrode on the bridge electrode and the metal protrusions; and applying a voltage on the auxiliary electrode or the bridge electrode to burn a portion of the electron transport layer and a portion of the electron injection layer corresponding to the corners of the metal protrusions due to the thickness is thinner and to connect the cathode electrode and the auxiliary electrode. By practice of the disclosure, the OLED panel could input the signal to the cathode electrode via the auxiliary electrode when displaying, so the mura effect of the OLED panel due to IR drop of the cathode electrode could be improved.

The foregoing contents are detailed description of the disclosure in conjunction with specific preferred embodiments and concrete embodiments of the disclosure are not limited to this description. For the person skilled in the art of the disclosure, without departing from the concept of the disclosure, simple deductions or substitutions can be made and should be included in the protection scope of the application.

What is claimed is:

1. A method of manufacturing an OLED panel, comprising the following steps:
   step S1: providing a TFT substrate, the TFT substrate comprising a base substrate, a TFT and an auxiliary electrode disposed on the base substrate and spaced apart from each other, and the TFT comprising a source electrode;
   step S2: forming a planarization layer on the TFT substrate, and patterning the planarization layer to form a first via and a second via respectively exposing the source electrode and the auxiliary electrode;
   step S3: forming an anode electrode and a bridge electrode spaced apart from the anode electrode, the anode electrode connected to the source electrode through the first via, and the bridge electrode connected to the auxiliary electrode through the second via;
   step S4: forming a plurality of metal protrusions on the bridge electrode, the surfaces of the metal protrusions having a plurality of corners;
   step S5: forming a pixel defining layer on the planarization layer, the anode electrode and the bridge electrode, the pixel defining layer including a first opening exposing the anode electrode, and the pixel defining layer exposing a region having the metal protrusions on the bridge electrode;
   step S6: sequentially forming a hole injection layer, a hole transport layer and an emitting layer on the anode electrode in the first opening, and sequentially forming an electron transport layer, an electron injection layer and a cathode electrode on the emitting layer, the pixel defining layer, the bridge electrode and the metal protrusions; and
   step S7: applying a voltage on the auxiliary electrode or the bridge electrode to burn a portion of the electron transport layer and a portion of the electron injection layer corresponding to the corners of the metal protrusions and form a plurality of second openings, and the cathode electrode connected to the metal protrusions through the second openings.

2. The method of manufacturing an OLED panel according to claim 1, wherein the TFT comprises:
   an active layer, disposed on the base substrate;
   a gate insulating layer and a gate electrode, sequentially disposed on the active layer;
   an interlayer insulating layer, covering the active layer and the gate electrode; and
   a drain electrode, spaced apart from the source electrode, and the drain electrode and the source electrode disposed on the interlayer insulating layer;
   wherein the auxiliary electrode includes a first sub-auxiliary electrode, the first sub-auxiliary electrode is disposed on the interlayer insulating layer and spaced apart from the source electrode and the drain electrode, and the second via exposes the first sub-auxiliary electrode;

wherein the interlayer insulating layer includes a third via and a fourth via respectively disposed on two sides of the active layer, and the source electrode and the drain electrode are respectively connected to the two sides of the active layer through the third via and the fourth via.

3. The method of manufacturing an OLED panel according to claim 2, wherein the auxiliary electrode further includes a second sub-auxiliary electrode, the second sub-auxiliary electrode is disposed on the base substrate;
wherein the TFT substrate further comprises:
a metal shielding layer, disposed on the base substrate and spaced apart from the second sub-auxiliary electrode; and
a buffer layer, disposed on the base substrate and covering the metal shielding layer and the second sub-auxiliary electrode;
wherein the active layer is disposed on the buffer layer and corresponding to the metal shielding layer, the interlayer insulating layer is disposed on the buffer layer and covers the active layer and the gate electrode, the buffer layer and the interlayer insulating layer include a fifth via exposed the second sub-auxiliary electrode, and the first sub-auxiliary electrode is connected to the second sub-auxiliary electrode through the fifth via.

4. The method of manufacturing an OLED panel according to claim 2, wherein the TFT substrate further comprises a passivation layer covering the interlayer insulating layer, the source electrode, the drain electrode and the first sub-auxiliary electrode, the planarization layer is formed on the passivation layer, the passivation layer includes a sixth via and a seventh via respectively exposing the source electrode and the first sub-auxiliary electrode, and the first via and the second via are respectively disposed on the sixth via and the seventh via.

5. The method of manufacturing an OLED panel according to claim 1, wherein the metal protrusions are block-shaped or stripe-shaped, and the sectional views of the metal protrusions are triangle-shaped or rectangle-shaped.

6. A method of manufacturing an OLED panel, comprising the following steps:
step S1: providing a TFT substrate, the TFT substrate comprising a base substrate, a TFT and an auxiliary electrode disposed on the base substrate and spaced apart from each other, and the TFT comprising a source electrode;
step S2: forming a planarization layer on the TFT substrate, and patterning the planarization layer to form a first via and a second via respectively exposing the source electrode and the auxiliary electrode;
step S3: forming an anode electrode and a bridge electrode spaced apart from the anode electrode, the anode electrode connected to the source electrode through the first via, and the bridge electrode connected to the auxiliary electrode through the second via;
step S4: forming a plurality of metal protrusions on the bridge electrode, the surfaces of the metal protrusions having a plurality of corners;
step S5: forming a pixel defining layer on the planarization layer, the anode electrode and the bridge electrode, the pixel defining layer including a first opening exposing the anode electrode, and the pixel defining layer exposing a region having the metal protrusions on the bridge electrode;
step S6: sequentially forming a hole injection layer, a hole transport layer and an emitting layer on the anode electrode in the first opening, and sequentially forming an electron transport layer, an electron injection layer and a cathode electrode on the emitting layer, the pixel defining layer, the bridge electrode and the metal protrusions; and
step S7: applying a voltage on the auxiliary electrode or the bridge electrode to burn a portion of the electron transport layer and a portion of the electron injection layer corresponding to the corners of the metal protrusions and form a plurality of second openings, and the cathode electrode connected to the metal protrusions through the second openings;
wherein the TFT comprises:
an active layer, disposed on the base substrate;
a gate insulating layer and a gate electrode, sequentially disposed on the active layer;
an interlayer insulating layer, covering the active layer and the gate electrode; and
a drain electrode, spaced apart from the source electrode the drain electrode, and the drain electrode and the source electrode disposed on the interlayer insulating layer;
wherein the auxiliary electrode includes a first sub-auxiliary electrode, the first sub-auxiliary electrode is disposed on the interlayer insulating layer and spaced apart from the source electrode and the drain electrode, and the second via exposes the first sub-auxiliary electrode;
wherein the interlayer insulating layer includes a third via and a fourth via respectively disposed on two sides of the active layer, and the source electrode and the drain electrode is respectively connected to the two sides of the active layer through the third via and the fourth via;
wherein the auxiliary electrode further includes a second sub-auxiliary electrode, the second sub-auxiliary electrode is disposed on the base substrate;
wherein the TFT substrate further comprises:
a metal shielding layer, disposed on the base substrate and spaced apart from the second sub-auxiliary electrode; and
a buffer layer, disposed on the base substrate and covering the metal shielding layer and the second sub-auxiliary electrode;
wherein the active layer is disposed on the buffer layer and corresponding to the metal shielding layer, the interlayer insulating layer is disposed on the buffer layer and covers the active layer and the gate electrode, the buffer layer and the interlayer insulating layer include a fifth via exposed the second sub-auxiliary electrode, and the first sub-auxiliary electrode is connected to the second sub-auxiliary electrode through the fifth via;
wherein the TFT substrate further comprises a passivation layer covering the insulating layer, the source electrode, the drain electrode and the first sub-auxiliary electrode, the planarization layer is formed on the passivation layer, the passivation layer includes a sixth via and a seventh via respectively exposing the source electrode and the first sub-auxiliary electrode, and the first via and the second via are respectively disposed on the sixth via and the seventh via;
wherein the metal protrusions are block-shaped or stripe-shaped, and the sectional views of the metal protrusions are triangle-shaped or rectangle-shaped.

* * * * *